United States Patent Office 3,666,467

Patented May 30, 1972

3,666,467

PHOTOGRAPHIC ELEMENT

Kenneth Reynolds and Thomas David Grinter Hellings, Pinnacles, Harlow, Essex, England, assignors to Minnesota Mining and Manufacturing Company No Drawing. Filed July 23, 1969, Ser. No. 844,182
Int. Cl. G03c 1/52, 1/64
U.S. Cl. 96—49 11 Claims

ABSTRACT OF THE DISCLOSURE

A photographic element having a photosensitive layer comprising, in reactive association, at least one photolytic diazonium salt and at least one palladium compound which is reducible to palladium metal by a photolysis product of said salt, the palladium metal being catalytic to the electrolytic deposition thereon of a base metal.

This invention relates to light-sensitive compositions and more particularly to photographic elements containing such compositions and developable by electroless plating techniques.

In such an imaging system the light-sensitive component, which can for example be a coating of a light-sensitive composition on a base layer, is first exposed to a light image and is then developed by immersing it in a plating bath. In the light-struck areas the light-sensitive composition is chemically changed during the light exposure and the chemical products resulting from photolysis cause a reduction of components in the developing bath to a free metal which is deposited imagewise on the sheet. U.S. Pat. 3,223,525 shows the use of certain aromatic diazo compounds in conjunction with silver or mercury compounds to provide latent or "germ" images on image recording elements.

According to the present invention there is provided a photographic element having a light-sensitive composition capable of being used in an electroless plating imaging system and comprising at least one diazonium salt which will undergo photolysis when exposed to light and in reactive association therewith at least one palladium compound which is capable of undergoing reduction to palladium metal by a photolysis product of the at least one diazonium salt, the palladium metal resulting from this reduction being capable of effecting catalytic reduction of a developer solution which includes a base metal salt and a reducing agent to give a deposit of the base metal thereon.

When the compositions of the invention are exposed to light, photolysis of the diazonium salt occurs and a photolysis product thereof reduces the palladium compound or compounds to free palladium metal nuclei which are then able to catalyse the reduction of the base metal salt during development. Because this free palladium metal acts merely as a catalyst in the reduction which occurs during development, it need only be present in relatively small amounts and accordingly only small amounts of the palladium metal compound are necessary to achieve a good developed image.

The light-sensitive compositions of the invention have the advantage of being sensitive to a relatively large portion of the visible light spectrum, and this light sensitivity arises from the use of the diazonium salt as the light-sensitive component of the composition.

The diazonium salt which is employed is preferably an aromatic diazonium salt, and can be chosen from a wide range of such salts, many of which are used in other types of imaging systems. Suitable ones include, for example, 4-diethylamino-benzene diazonium zinc chloride, 4-dimethylamino-benzene diazonium zinc chloride, 4(N-ethyl - N - hydroxyethylamino)-benzene diazonium zinc chloride, 4(N-methyl - N - hydroxyethylamino)-benzene diazonium zinc chloride, 4-diethylamino-3-ethoxy-benzene diazonium zinc chloride, 4-diethylamino-2-chloro-benzene diazonium zinc chloride, 2,5-diethoxy-4-phenyl-acetamino-benzene diazonium zinc chloride, 2,5-diethoxy-4-(p-tolylthio)-benzene diazonium zinc chloride, 4-diazo diphenylamino sulphate, the condensation product of 4-diazo diphenylamine sulphate and formaldehyde, 1-diazo-2-naphthol-4-sulphonic acid, and 2-diazo-1-naphthol-5-sulphonic acid.

As noted above only fairly small quantities of the palladium compound are required. For example, a photosensitive layer which when the composition includes from about 0.01 to about 10 mg. of at least one palladium compound per square decimeter has given good results.

The molar ratio of the diazonium salt or salts to a palladium compound or compounds should desirably be at least 2 and preferably from 2 to 10, the lower ratio corresponding to that needed to form the complex $(RN_2)_2PdCl_4$ where palladium chloride is used.

The photo-sensitive layer of the invention will normally be employed on a supporting base such as for example a paper sheet, a polyester or acetate film base or a glass plate. In the case of paper sheet bases it may be sufficient to provide merely a coating of the diazonium compound and palladium compound, although a binder such as for example polyvinyl pyrrolidone may be added to assist coating. In other cases it may be desirable to include with the composition a binder such as for example polyvinyl alcohol.

The following examples are presented for illustrative purposes only, and should not be construed as limiting the scope of the present invention.

EXAMPLE I 0.088 g. of palladium chloride was dissolved in 100 ml. of water containing 0.4 ml. of concentrated hydrochloric acid. 5 g. of polyvinyl pyrrolidone was added and this solution was then added to a solution of 1.4 g. of 4-diethylamino-benzene diazonium zinc chloride dissolved in 100 ml. of water. Finally 5 ml. of 4% aqueous saponin was added and the resulting mixture was coated onto a paper base.

After drying, the coating was exposed through a photographic negative to the light from a mercury vapor lamp. The coating was then immersed for 2 minutes in a solution of the following composition at a temperature of 80° C:

| | G. |
|---|---|
| Nickel chloride hexahydrate | 20 |
| Cobalt chloride hexahydrate | 40 |
| Potassium sodium tartrate tetrahydrate | 200 |
| Ammonium chloride | 50 |
| Glycine | 20 |
| Succinic acid | 7 |
| Sodium hypophosphite | 30 |

Water to 1000 ml.
10 N sodium hydroxide to give pH 9.

After washing in water, a stable black positive print on a white background was obtained.

EXAMPLE II

Following the same procedure as for Example I but using as the diazonium compound 0.3 g. of 4-(N-ethyl-N-hydroxyethylamino)-benzene diazonium zinc chloride, a black positive print on a white background was obtained.

EXAMPLE III

Following the same procedure as for Example I but using as the diazonium compound 1.41 g. of 4-(N-methyl- N-hydroxyethylamino)-benzene diazonium zinc chloride, a black positive print on a white background was obtained.

EXAMPLE IV

Following the same procedure as for Example I but using as the diazonium compound 1.58 g. of 4-diethylamino-2-chloro-benzene diazonium zinc chloride, a black positive print on a cream background was obtained.

EXAMPLE V

Following the same procedure as for Example I but using as the diazonium compound 2.09 g. of 2,5-diethoxy-4-phenylacetamino-benzene diazonium zinc chloride, a black positive print on a pale buff background was obtained.

EXAMPLE VI

Following the same procedure as for Example I but using as the diazonium compound 2.1 g. of 2,5-diethoxy-4-(p-tolylthio)-benzene diazonium zinc chloride, a black positive print on a pale buff background was obtained.

EXAMPLE VII

Following the same procedure as for Example I but using as the diazonium compound 1.5 g. of 4-diazo diphenylamino sulphate, a black positive print on a white background was obtained.

EXAMPLE VIII

Following the same procedure as for Example I but using as the diazonium compound 1.47 g. of the condensation product of 4-diazo-diphenylamino sulphate and formaldehyde, a black positive print on a white background was obtained.

EXAMPLE IX 0.088 g. of palladium chloride was dissolved in 100 ml. of water containing 0.4 ml. of concentrated hydrochloric acid. 5 g. of polyvinyl pyrrolidone was then dissolved in this solution and the mixture added to a solution of 1.48 g. of 4-(N-ethyl-N-hydroxyethylamino)-benzene diazonium zinc chloride dissolved in 100 ml. of water. Finally 5 ml. of 4% aqueous saponin was added and the complete mixture coated onto a paper base.

After drying the coating was exposed through a photographic negative to the light from a mercury vapor lamp. It was then immersed in the following solution for 2 minutes at a temperature of 85° C.:

| | G. |
|---|---|
| Nickel chloride hexahydrate | 27 |
| Sodium tungstate dihydrate | 30 |
| Potassium sodium tartrate | 100 |
| Ammonium chloride | 50 |
| Glycine | 23 |
| Sodium hypophosphite | 20 |

Water to 1000 ml.
10 N sodium hydroxide to give a pH of 9.0.

After washing in water, a stable black image on a white background was obtained.

EXAMPLE X

Following the same procedure as for Example IX but using as the diazonium compound 1.41 g. of 4-(N-methyl-N-hydroxyethylamino)-benzene diazonium zinc chloride, a black positive print on a white background was obtained.

EXAMPLE XI

Following the same procedure as for Example IX but using as the diazonium compound 1.48 g. of 4-diethylamine-3-ethoxy benzene diazonium zinc chloride, a black positive print on a white background was obtained.

EXAMPLE XII

Following the same procedure as for Example IX but using as the diazonium compound 1.35 g. of 4-dimethylamino-2-chloro-benzene diazonium zinc chloride, a black positive print on a pale buff background was obtained.

EXAMPLE XIII 0.88 g. of palladium chloride was dissolved in 100 ml. of water containing 0.4 ml. of concentrated hydrochloric acid. 5 g. of polyvinyl pyrrolidone was then added and the resulting solution was added to a solution of 1.4 g. of 4-diethylaminobenzene diazonium zinc chloride in 100 ml. of water. Finally, 5 ml. of 4% aqueous saponin was added and this mixture coated onto a paper base.

After drying the coating was exposed through a photographic negative to the light from a mercury vapor lamp. It was then immersed for 5 minutes in the following solution at a temperature of 22° C.:

| | G. |
|---|---|
| Sodium hydroxide | 50 |
| Sodium carbonate | 30 |
| Potassium sodium tartrate tetrahydrate | 100 |
| Copper sulphate pentahydrate | 30 |

36% aqueous formaldehyde—15 ml.
Water to 1000 ml.

After washing in water, a stable black positive print on a pale buff background was obtained.

EXAMPLE XIV

Following the same procedure as for Example XIII but using on the diazonium compound 1.35 g. of 4-dimethylaminobenzene diazonium zinc chloride, a black positive print on a pale buff background was obtained.

EXAMPLE XV

Following the same procedure as for Example XIII but using as the diazonium compound 1.48 g. of 4-(N-ethyl-N-hydroxyethylamino)-benzene diazonium zinc chloride, a black positive print on a buff background was obtained.

EXAMPLE XVI

Following the same procedure as for Example XIII but using as the diazonium compound 1.47 g. of 2-diazo-1-naphthol-5-sulphonic acid, a black positive print on a buff background was obtained.

EXAMPLE XVII

Following the same procedure as for Example I but using as the diazonium compound 1.25 g. of 1-diazo-2-naphthol-4-sulphonic acid, a black positive print on a white background was obtained.

EXAMPLE XVIII

Following the same procedure as for Example I but using as the diazonium compound 1.25 g. of 2-diazo-1-naphthol-5-sulphonic acid, a black positive print on a white background was obtained.

What is claimed is:

1. A photographic element having a photosensitive layer comprising in reactive association at least one diazonium salt capable of undergoing photolysis upon light exposure and at least one palladium compound which is capable of being reduced to paladium metal by a photolysis product of said at least one diazonium salt, said palladium metal being catalytic to the electroless deposition thereon of a base metal.

2. The photographic element of claim 1 wherein the molar ratio of said at least one diazonium salt to said at least one palladium compound is at least 2.

3. The photographic element of claim 2 in which said molar ratio is from 2 to 10.

4. The photographic element of claim 1 wherein said at least one palladium compound is palladium chloride.

5. The photographic element of claim 1 wherein said photo-sensitive layer includes from about 0.01 to about 10 miligrams of said at least one palladium compound per square decimeter.

6. An imaging process comprising the steps of (a) exposing to a light image a photographic element having a photo-sensitive layer comprising in reactive association at least one diazonium salt capable of undergoing photolysis upon exposure to light and at least one palladium compound capable of being reduced to palladium metal by a photolysis product of said at least one diazonium salt, said palladium metal being catalytic to the electroless deposition thereon of a base metal; and (b) treating said exposed element with a developer solution comprising a salt of said base metal and a reducing agent therefor, thereby providing a visible deposit of said base metal in light-exposed areas of said photographic element.

7. A photographic element having a photosensitive layer which comprises, in reactive association, palladium chloride and at least one diazonium salt, the photolysis product of which salt is capable of reducing said palladium chloride to palladium metal which is catalytic to the electroless deposition thereon of a base metal.

8. The element of claim 7 wherein said diazonium salt is a benzene diazonium zinc chloride salt.

9. The element of claim 7 wherein the molar ratio of said diazonium salt to said palladium chloride is 2 to 10.

10. The element of claim 7 wherein said palladium chloride is present in said photosensitive layer in an amount of from about 0.01 to about 10 milligrams per square decimeter.

11. The element of claim 7 wherein said diazonium salt is 4-diethylamino-benzene diazonium zinc chloride.

References Cited

FOREIGN PATENTS 695,723 9/1967 Belgium ---------- 96—48 PD

NORMAN G. TORCHIN, Primary Examiner

E. C. KIMLIN, Assistant Examiner

U.S. Cl. X.R.

96—49, 91